United States Patent [19]

Beitner

[11] Patent Number: 5,355,678

[45] Date of Patent: Oct. 18, 1994

[54] THERMOELECTRIC ELEMENT MOUNTING APPARATUS

[76] Inventor: Shlomo Beitner, 3900 N. Lakeshore Dr., Chicago, Ill. 60613

[21] Appl. No.: 64,818

[22] Filed: May 19, 1993

[51] Int. Cl.⁵ .......................... F25B 21/02; B25B 5/14
[52] U.S. Cl. ........................................ 62/3.2; 62/298; 403/405.1; 403/408.1; 403/337; 269/254 R
[58] Field of Search .................. 62/3.2, 298; 403/11, 403/408.1, 405.1, 337, 306, 205; 269/254 R

[56]  References Cited

U.S. PATENT DOCUMENTS

| 262,032 | 8/1882 | Ferguson | 403/405.1 |
| 774,870 | 11/1904 | Ferrall | 403/11 |
| 3,744,560 | 7/1973 | Sell | 165/185 |
| 3,877,764 | 4/1975 | Hillier | 312/107 |
| 3,903,582 | 9/1975 | Sweeney et al. | 29/411 |
| 4,092,138 | 5/1978 | Beitner . | |
| 4,107,934 | 8/1978 | Beitner . | |
| 4,143,711 | 3/1979 | Beitner . | |
| 4,175,728 | 11/1979 | Ferguson | 269/91 |
| 4,514,105 | 4/1985 | Adams et al. | 403/24 |
| 4,622,822 | 11/1986 | Beitner | 62/3.2 |

*Primary Examiner*—Henry A. Bennet
*Assistant Examiner*—William C. Doerrler
*Attorney, Agent, or Firm*—Wallenstein, Wagner & Hattis, Ltd.

[57] ABSTRACT

An apparatus for consistently applying a predetermined centrally located compressive force to an element positioned between a first compressive member and a second compressive member is disclosed. The apparatus includes a bracket which holds compressive members in a clamping relationship about the element. The bracket includes a force generating web, a first leg and a second leg. The bracket is arranged to provide a centrally located compressive force when in the clamped relationship.

30 Claims, 4 Drawing Sheets

THERMOELECTRIC ELEMENT MOUNTING APPARATUS

DESCRIPTION

1. Technical Field

This invention relates to an improved apparatus for mounting a thermoelectric module, and more specifically, to an apparatus for applying a predetermined compressive force or pressure to a thermoelectric module positioned between a first and a second thermal conducting member.

2. Background of the Invention

Thermoelectric modules of the Peltier type are used in applications where electric heating and cooling is desired or for power generation, as disclosed, for example, in U.S. Pat. Nos. 4,092,138; 4,107,934; and 4,143,711. Such thermoelectric modules comprise current carrying elements having hot and cold junctions sandwiched between a pair of opposed, flat, parallel sheets, or substrates, constructed of $Al_2O_3$, or a similar material having relatively low electrical conductivity and relatively high thermal conductivity.

Figure 3:
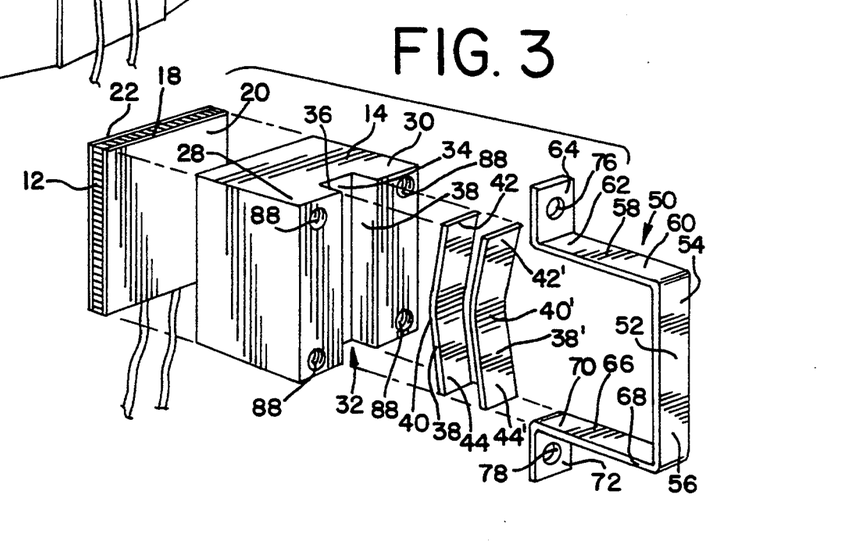
FIG. 3 is an exploded view of the apparatus shown in FIG. 1.

The thermoelectric module is ordinarily mounted between spaced thermal or heat conducting members or elements having parallel planar surfaces as shown in FIG. 3 of both U.S. Pat. Nos. 4,107,934 and 4,143,711. The surfaces of the thermal conducting members are maintained in close contact with the respective substrates of the thermoelectric module. Close contact is maintained by disposing and arranging the thermal conducting members to exert a compressive force upon the opposed faces of the substrates of the thermoelectric module. The compressive force is developed by a pair of bolts that are positioned on opposing sides of the thermoelectric module and which operate to hold a first and second thermal conducting member in a sandwiched relationship about the thermoelectric module. The thermal conducting members provide pressing surfaces for contact with the substrates of the module that are at least equal to the size of the module's substrates.

It is presently inefficient to mount thermoelectric modules between thermal conducting members under compression as described above because the substrates of the thermoelectric module are frangible or brittle. When compressional forces are applied to the thermal conducting members, it is often the case that the forces are applied nonuniformly, so that there are developed regions of high pressure upon the faces of the thermoelectric module. As in the prior art described, forces will be greater near the bolts holding the thermal conducting members together. Due to the nonuniform forces, fracture of one or both substrates of the thermoelectric module sometimes occurs during the assembly process, or in operation in the field, due to vibration, shock, and temperature changes.

An improved mounting apparatus that regulates the compressional force applied to the thermal conducting members, and which locates the applied compressional force to insure that the resulting pressures are distributed over the substrate of the thermoelectric module is disclosed in U.S. Pat. No. 4,622,822 (S. Beitner). In this reference, a generally arcuate or V-shaped spring member or leaf spring includes an intermediate bowed portion between opposing ends, which engages a central portion of the outer surface of one of the thermal conducting members. The ends of the leaf spring are connected to the ends of hollow internally threaded spacer tubes which fit into bores in the thermal conducting members. The spacer tubes are located on opposing sides of the thermoelectric module. Threaded bolts are then utilized to hold the tubes, leaf spring, and thermal conducting members in a sandwiched relationship around the module. In this manner, the compression force is more centrally located and evenly distributed. However, using this apparatus, it is difficult to consistently apply a predetermined compression force against the thermoelectric module in assembly of the mounting apparatuses. This is because it is difficult to accurately apply a spring tensioning pressure to the ends of the leaf spring by means of the spacer tubes using bolts. If the proper number of turns is not made on each bolt, the applied pressure will vary. Thus, a need exists for an apparatus which may be used to assemble mounted thermoelectric modules and be assured that a consistent predetermined compression force or pressure is being applied to each module.

SUMMARY OF THE INVENTION

The invention is an apparatus for accurately applying a predetermined compressive force to an element to be mounted, preferably a thermoelectric module having opposite generally planar surfaces, between a first compressive member and a second compressive member forming a part of the apparatus. The compressive members each having planar surfaces adapted to abut planar surfaces of the element to be mounted. Where the element is a thermoelectric module, the compressive members preferably are thermal conducting members.

The apparatus further comprises a clamping bracket having a force generating web for applying a centrally located compressive force to an outer surface of the first compressive member. A first bracket leg having a predetermined length extends perpendicularly from one end of the bracket web. A second bracket leg having a predetermined length extends perpendicularly from the opposite end of the bracket web and in spaced confronting relation to the first bracket leg. The ends of the first and second bracket legs include means for securing the same to the second compressive member. The bracket holds the first compressive member and the second compressive member in a clamping relationship about the element to be mounted.

The force generating web of the bracket may include an inwardly bowed spring-forming mid portion of the bracket web or it may include one or more elongated spring members or leaf springs positioned between the bracket web and the first compressive member. Each spring member may include opposing first and second ends and an intermediate bowed portion offset from the plane of the ends of the member. The bowed mid portion of the bracket web or the spring member abuts the first compressive member to provide a centrally located compressive force which urges the element to be mounted toward the other compressive member.

The securing means of the first and second bracket legs may comprise flanges connected to the ends of the bracket legs. Each flange includes a hole which is aligned with a bore in the second compressive member when secured to the second compressive member. Bolts are positioned through the holes and bores to secure the flanges to the second compressive member.

In another embodiment, the second compressive member may include a first slot on one side of the surface abutting the element to be mounted and a second slot on an opposing side of the surface abutting the element to be mounted. The slots are aligned with the first and second bracket legs respectively. In this embodiment, a portion of the first bracket leg would extend through the first slot and a portion of the second bracket leg would extend through the second slot when the first and second bracket legs are secured to the second compressive member.

The securing means of the first bracket leg may alternatively include a pin positioned through a hole in the portion of the first bracket leg extending through the first slot. Similarly, the securing means of the second bracket leg may include a pin positioned through a hole in the portion of the second bracket leg extending through said second slot.

Alternatively, the securing means of the first bracket leg may comprise a first flange on the portion of the first bracket leg extending through the first slot and a second flange on the portion of the first bracket leg extending through the first slot. The first and second flanges are offset from the first bracket leg at opposing angles. In this manner, the portion of the leg extending through the slot is prevented from going back through the slot. A similar arrangement may be utilized on the second bracket leg.

In a further embodiment, a first bracket can be secured to a second compressive member by means of a second opposing bracket extending from the second compressive member. To obtain a clamping relationship, the legs of the first bracket are secured to the legs of the second bracket.

Further aspects of the invention are described in the detailed description or shown in the Figures.

DETAILED DESCRIPTION OF THE PREFERRED EMBODIMENT

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

Figure 1:
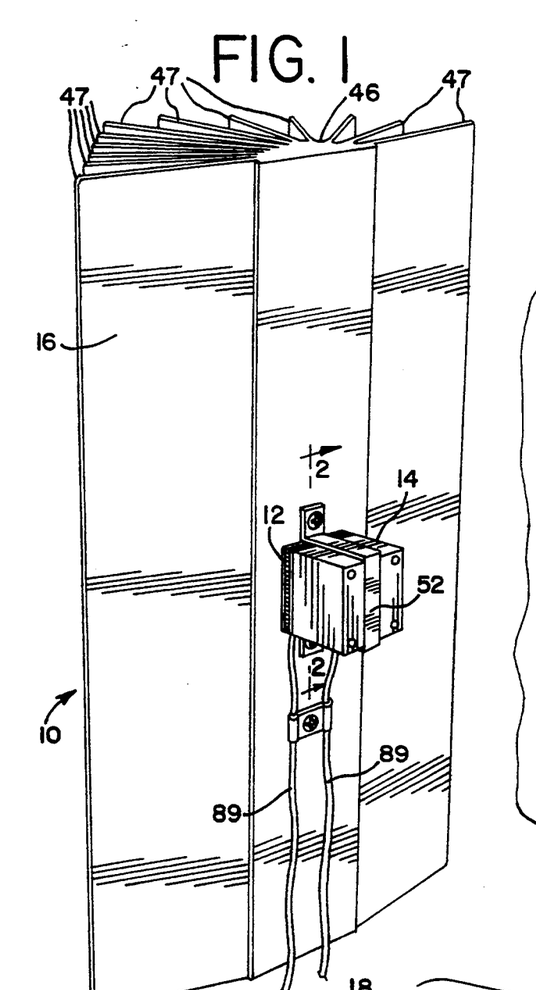
FIG. 1 is a perspective view illustrating one form of the apparatus of the present invention.
Figure 2:
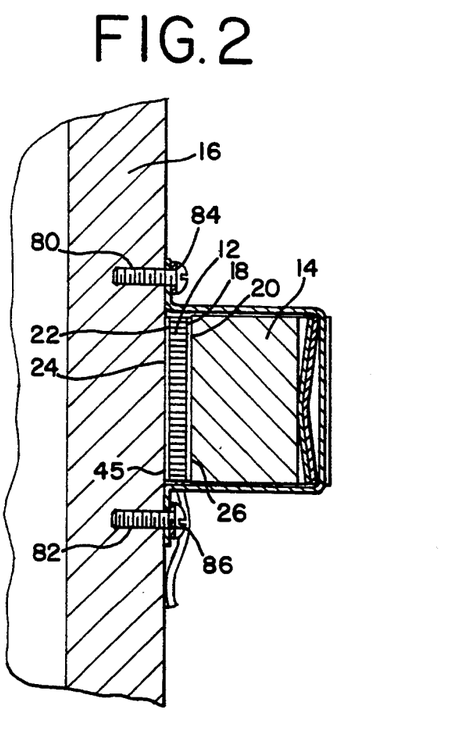
FIG. 2 is a cross-sectional view of the apparatus shown in FIG. 1 taken along the line 2—2.

As illustrated in FIGS. 1-3, an improved apparatus, generally designated by the number 10, for mounting a Peltier effect thermoelectric module 12 is shown. The apparatus 10 applies a centrally located predetermined compression force or pressure to the thermoelectric module 12 sandwiched between two compression members. The compression members are in the form of a first heat sink or thermal conducting member 14 and a second heat sink or thermal conducting member 16. The first and second thermal conducting members 14,16 can be made from a variety of materials, such as aluminum, having the appropriate thermal conductive properties. While the preferred embodiment is described in terms of applying pressure to Peltier effect thermoelectric module 12, the invention may be used with other elements which require intimate contact with two compression members.

The module 12 includes a first frangible substrate 18 having a generally planar first surface 20. The module 12 further includes a second frangible substrate 22 having a generally planar second surface 24 opposing the first surface 20.

The first thermal conducting member 14 is formed generally in the shape of a block. The first thermal conducting member 14 includes a first generally flat surface 26 adapted to abut the first surface 20 of the thermoelectric module 12. The first thermal conducting member 14 further includes a first flange element 28 and a second flange element 30 spaced apart from the first flange element 28. A centrally located rectangular channel 32 is formed between the first flange element 28 and the second flange element 30. The channel 32 includes a second generally flat surface 34 parallel to the surface 26 abutting the thermoelectric module 12. A surface 36 of the first flange element 28 forms one wall of the channel 32 and a surface 38 of the second flange element 30 forms an opposing wall of the channel 32.

The channel 32 is sized to receive one or more elongated bowed spring members or leaf springs. In the embodiment shown in FIGS. 1-3, a first leaf spring 38 and a second leaf spring 38' nested with the first leaf spring 38 are disclosed; however, in many applications one leaf spring may be sufficient. Alternatively, more than two leaf springs may be used if necessary.

The leaf springs 38,38' are arcuate or V-shaped in cross-section having intermediate bowed portions 40,40' between first ends 42,42' and opposing second ends 44,44'. The bowed portions 40,40' are offset from a plane defined by the first 42,42' and second 44,44' ends.

The bowed portion 40 of the first leaf spring 38 engages a central portion of the second surface 34 of the channel 32 to apply a centrally located compression force to the first thermal conducting member 14 as explained below.

The second thermal conducting member 16 includes a first generally flat surface 45 adapted to abut the second surface 24 of the thermoelectric module 12. The second thermal conducting member 16 further includes a second arcuate surface 46 upon which is provided a plurality of heat dissipating fins 47 spaced from each other to permit free flow of air for heat dissipation.

A clamping bracket 50 is utilized to hold the first thermal conducting member 14 and the second thermal conducting member 16 about the thermoelectric module 12 in a clamping relationship. The module 12 must be maintained in intimate contact with the first and second thermal conducting members 14,16 to properly conduct heat away from or towards the module 12 as is necessary.

The bracket 50 is designed to cooperate with the leaf springs 38,38' to accurately and consistently apply a predetermined compression force to the thermoelectric module 12.

The bracket 50 includes a force generating web. In the embodiment shown in FIGS. 1-3, the force generating web is in the form of a rectangular spring engaging portion 52 having a first end 54 and an opposing second end 56. A rectangular first bracket leg 58 extends perpendicular to the spring engaging portion 52 and is integrally connected at a first end 60 to the first end 54 of the spring engaging portion 52. The first leg 58 extends from the first end 60 a predetermined length to a second end 62 connected to a first flange or securement portion 64.

A rectangular second bracket leg 66 extends perpendicular to and is integrally connected at a first end 68 to the second end 56 of the spring engaging portion 52. The second leg 66 extends from its first end 68 in the same general direction as the first leg 58 a predetermined length to a second end 70 connected to a second flange or securement portion 72.

The first securement portion 64 includes a screw hole 76 and extends away from the second securement portion 72 in a plane generally parallel to the spring engaging portion 52. The second securement portion 72 includes a screw hole 78 and extends away from the first securement portion 64 in a plane generally parallel to the spring engaging portion 52. The first and second securement portions 64,72 are used to secure the bracket 50 to the second thermal conducting member 16.

In operation, the thermoelectric module 12 is first positioned between the first thermal conducting member 14 and the second thermal conducting member 16. The leaf springs 38,38° are then positioned in the channel 32. The bracket 50 is then placed over the leaf springs 38,38° with the first and second legs 58,66 extending along the sides of the first thermal conducting member 14 to bring the first and second securement portions 64,72 into contact with the second thermal conducting member 16.

The second thermal conducting member 16 is provided with threaded bores 80,82 axially aligned with the screw holes 76,78 of the first and second securement portions 64,72. Threaded screws or bolts 84,86 are then utilized to secure the bracket 50 to the second thermal conducting member 16. Additionally, other fastening means, such as rivets or nails, may be used to secure the legs 58,66 of the bracket 50 to the second thermal conducting member 16.

While the first and second securement portions 64, 72 are shown as being brought into direct contact with the second thermal conducting member 16, it is sometimes advantageous to at least partially insulate the clamping bracket 50 from the second thermal conducting member 16. This may be accomplished by slightly spacing the securement portions 64, 72 from the second thermal conducting member 16.

Washers having a predetermined width may be inserted around the screws 84, 86 between the securement portions 64, 72 and the second thermal conducting element 16. The washers may be made of an insulating material having the appropriate thermal conducting properties necessary for a particular purpose. Thus, as the screws are fully tightened, the washers will form an insulating gap between the securement portions 64, 72 of the bracket 50 and the second thermal conducting member 16. The screws 84, 86 may also be made from an insulating material to further shield the bracket 50.

Alternatively, a removable obstruction having a predetermined width may be placed between the securement portions 64, 72 and the second thermal conducting member 16. After the screws 84, 86 are fully tightened, the obstruction is removed to form an air gap between the securement portions 64, 72 and the second thermal conducting member 16.

Since the widths of the washers or air gaps can be controlled, they can be used to adjust the tensioning pressure applied to the leaf springs 38, 38'. This also allows for use of a bracket 50 having legs 58, 66 with predetermined lengths with larger first thermal conducting members.

The bracket 50 and leaf springs 38,38' operate to hold the first thermal conducting member 14 and the second thermal conducting member 16 in a tight heat transfer relation about the thermoelectric module 12. When the screws 84,86 are fully tightened, a predetermined tensioning force is applied by the spring engaging portion 53 to the ends 42,42' and 44,44' of the leaf springs 38,38'. The spring tensioning force is a function of the length of the legs 58,66. The leaf springs 38,38' in turn, apply a centrally located compression force through their intermediate portions 40,40' to a central portion of the second surface 34 of the first thermal conducting member 14 as described below.

The spring engaging portion 52 of the bracket 50 is designed to have a width slightly less than the width of the channel 32. In this manner, as the bracket 50 is secured to the second thermal conducting member 16, the spring engaging portion 52 enters the channel 32 and engages and applies tension to the first ends 42,42' and second ends 44,44' of the leaf springs 38,38'.

The bowed portions 40,40' of the leaf springs 38,38' are arranged to apply a compressive force substantially through the central portions of the first thermal conducting member 14 and the thermoelectric module 12. Thus, when the thermoelectric module 12 is in position between the surfaces 24,26 of the first and second thermal conducting members 14,16, the centers of the substrates 18,22 are in position for optimal thermal contact with the first and second thermal conducting members 14,16, respectively.

The surfaces 36 and 37 forming the walls of the channel 32, together with the spring engaging portion 52 and portions of the first and second legs 58,66 prevent the leaf springs 38,38' from leaving the channel 32.

Since the first and second legs 58,66 of the bracket 50 have a predetermined length, a predetermined tensioning force is applied to the leaf springs 38,38' and in turn, to the second surface 34 of the first thermal conducting member 14. The compression force is then transferred to the thermoelectric module 12. Thus, a plurality of brackets 50 may easily be used for assembly of the apparatuses to consistently provide a predetermined compressive force to the thermoelectric modules 12.

The first thermal conducting member 14 is further provided with threaded bores 88 on the flanges 28 and 30. The bores 88 cooperate with screws or bolts to attach the mounted device 10 to a box or apparatus (not shown) that may be used for cooling or heating a substance therein.

Leads 89 connect the thermoelectric module to electrical components (not shown).

Figure 4:
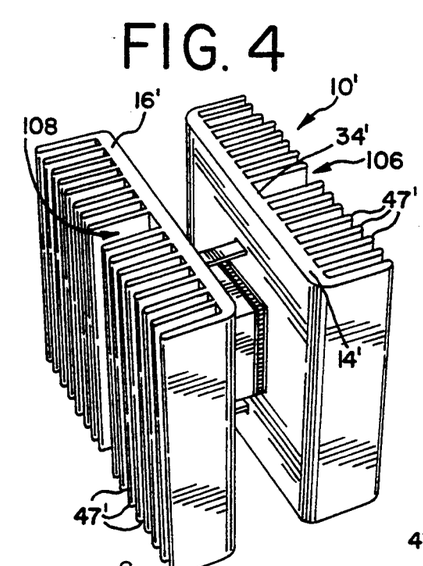
FIG. 4 is a perspective view illustrating a modified form of the apparatus of the present invention.
Figure 5:
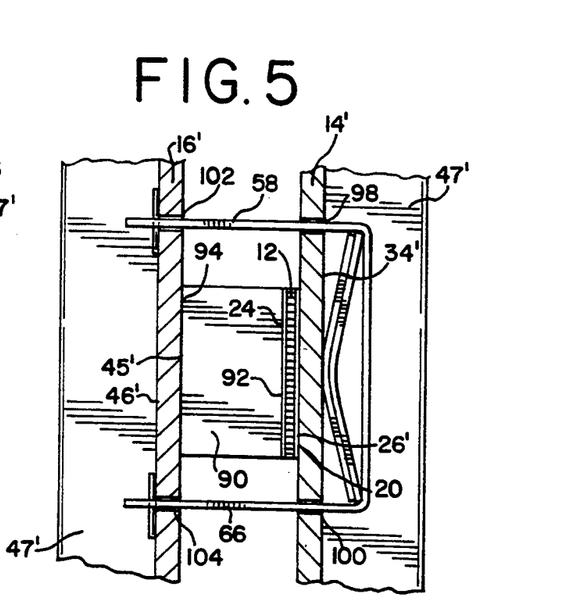
FIG. 5 is a cross-sectional view of the apparatus shown in FIG. 4.

A modified form of the apparatus 10' is shown in FIGS. 4 and 5. A thermoelectric module 12 is sandwiched between a first thermal conducting member 14' and a second thermal conducting member 16'. The first thermal conducting member 14' and the second thermal conducting member 16' are substantially identical and have a cross-sectional area greater than the cross-sectional area of the thermoelectric module 12.

As shown in FIGS. 4 and 5 an aluminum thermal conducting block 90 is interposed between the second thermal conducting member 16' and the thermoelectric module 12. However, it is not mandatory that the thermal conducting block 90 be present. Instead, the thermoelectric module 12 may be in direct intimate contact with both the first and second thermal conducting members 14',16'.

The first thermal conducting member 14' includes a first surface 26' adapted to abut the first surface 20 of the thermoelectric module 12. The first thermal conducting member 14' further includes an opposing second surface 34'. A plurality of spaced heat dissipating fins 47' are provided on the second surface 34'.

The thermal conductive block 90 includes a first generally flat surface 92 adapted to engage the second surface 24 of the thermoelectric module 12. The thermal conducting block 90 further includes a second opposing generally flat surface 94 adapted to engage a first surface 45' of the second thermal conducting member 16'. In the present embodiment, the thermal conducting block 90 acts, in effect, as an extension of the second thermal conducting member 16'. Alternatively, as mentioned above, the thermal conducting block 90 may be removed. In which case, the first surface 45' of the second thermal conducting element 16' would be in direct contact with the second surface 24 of the thermoelectric module 12.

The second thermal conductive member 16' further includes an opposing second surface 46' upon which is provided a plurality of spaced heat dissipating fins 47'.

While the area of the surface 92 of the thermal conducting block 90 is shown as equal to the cross-sectional area of the second surface 24 of the thermoelectric module 12, the thermoelectric module 12 may have a smaller cross-sectional area. Additionally, the surface 92 of the block 90 does not have to be square. Other shapes, such as a rectangular shape or a trapezoidal shape, will function properly in the mounting device 10'.

A modified bracket 50' and first and second leaf springs 38, 38' are utilized to secure the first thermal conducting member 14' the thermal conducting block 90 and the second thermal conducting member 16' in a tight heat transfer clamped relationship with the thermoelectric module 12. Again, while two nested leaf springs 38,38' are shown, one leaf spring may be sufficient for a particular application. Alternatively, more than two leaf springs may be used if necessary.

Figure 6:
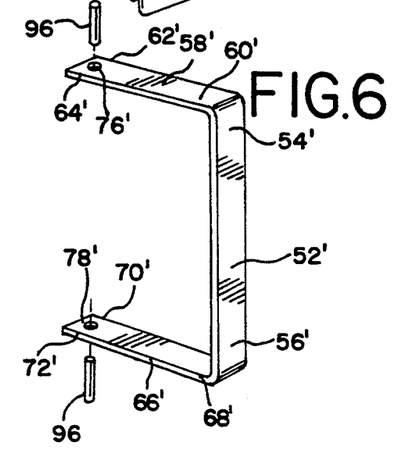
FIG. 6 is a perspective view of a clamping bracket portion of the apparatus shown in FIG. 4.

The bracket 50', shown isolated in FIG. 6, includes a force generating web in the form of a generally rectangular spring engaging portion 52' having a first end 54' and an opposing second end 56'. A generally rectangular first bracket leg 58' is connected at a first end 60' to the first end 54' of the spring engaging portion 52'. The first leg 58' extends in a perpendicular direction to the spring engaging portion 52' a predetermined length to a second end 62'. The second end 62' of the first leg 58' includes a first securement portion 64' to secure the first bracket leg 58' to one of the thermal conducting members 14',16', as explained below.

A generally rectangular second leg 66' is connected at a first end 68' to the second end 56' of the spring engaging portion 52'. The second leg 66' extends in the same direction as the first leg 58' perpendicular to the spring engaging portion 52' a predetermined length to a second end 70'. The second end 70' of the second leg 66' also includes a second securement portion 72' to secure the second bracket leg 66' to one of the thermal conducting members 14',16' as explained below The first securement portion 64' includes a circular hole 76'. Similarly, the second securement portion 72' includes a circular hole 78'. The holes 76',78' cooperate with pins 96 to secure the bracket 50' to one of the thermal conducting members 14',16'.

In operation, the first and second bracket legs 58',66' of the bracket 50' are first inserted through first and second slots 98,100, respectively, in the first thermal conducting member 14' around the leaf springs 38,38' so that the leaf springs 38,38' are positioned between the first thermal conducting member 14' and the spring engaging portion 52' of the bracket 50'. The leaf springs 38,38' are arranged in a nested relationship with the bowed portion 40 of the first leaf spring 38 abutting the first thermal conducting member 14'. The first and second legs 58',66' are further inserted through the slots 98,100 past the thermoelectric module 12 and thermal conducting block 90 and through first and second slots 102,104 in the second thermal conducting member 16'. The slots 102,104 in the second thermal conducting member 16' are aligned with the slots 98,100, respectively, in the first thermal conducting member 14'. The aligned slots are positioned on opposing sides of the thermoelectric module 12.

A portion of the first and second legs 58',66' extend through the slots 102,104 in the second thermal conducting member 16' sufficiently to allow the holes 62',70' to pass completely through the respective slots 102,104. The pins 96 are then positioned through the holes 62',70', to secure the bracket to the second thermal conducting member 16'. In order to insert the holes 62',70' completely through the slots 102,104, the spring engaging portion 112 of the bracket 50' engages and applies a tensioning force to the ends of the leaf springs 38,38'. The compressed leaf springs 38,38' provide a sufficient force on the spring engaging portion 52' and, in turn, on the legs 58',66' so that the pins 96 are securely lodged against the second surface 46' of the second thermal conducting member 16'.

The bracket 50' leaf springs 38,38' and aligned slots 98,100 and 102,104 are positioned so that compressive forces in the clamped relationship are centrally located against the thermoelectric module 12. In order to accommodate the bracket 50' and the leaf springs 38,38' in the appropriate centralized position, a sufficiently wide gap 106 in the heat dissipating fins 47' of the first thermal conducting member 14' is provided at this location. Similarly, a gap 108 is provided in the heat dissipating fins of the second thermal conducting member 16' to accommodate the pins 96 and securement portions 64',72' of the bracket legs 58',66'.

It is readily apparent that the bracket 50' and leaf spring 38,38' arrangement may be reversed. That is, the first and second legs 58',66' may be first inserted through the slots 102,104 of the second thermal conducting member 16' and secured by pins 96 to the first thermal conducting member 14'. The leaf springs 38,38' would be positioned between the spring engaging portion 52' and the second thermal conducting member 16' and have their bowed portions 40 abutting the second surface 46' of the second thermal conducting member 16'. Additionally, two brackets facing opposite directions may be used to clamp the thermal conducting members 14',16' about the thermal conducting block 90 and thermoelectric module 12. However, in such an embodiment, the spring engaging portion of one of the brackets should be sufficiently larger than the spring engaging portion of the other bracket. Thus, the legs and pins arrangement of one bracket will not interfere with that of the other bracket.

Figures 7, 8:
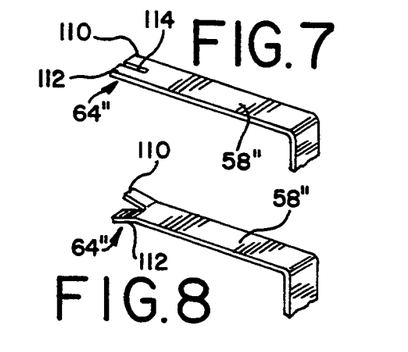
FIGS. 7 and 8 are partial perspective views illustrating a modified securement portion of a clamping bracket otherwise similar to the bracket shown in FIG. 6.

FIGS. 7 and 8 disclose an modified securement portion 64" for a clamping bracket 50". The securement portion 64" comprises a first flange 110 and a second flange 112. The flanges 110,112 define a groove 114 between them. After the securement portion 64" is inserted through the slot 102 in the second thermal conducting member 16' the flanges 110,112 are slightly bent at opposite angles so that they are offset from the plane defined by the leg 58". The offset flanges 110,112 prevent the securement portion 64" from passing back through the slot 102 in the second thermal conducting member 16'.

Figure 9:
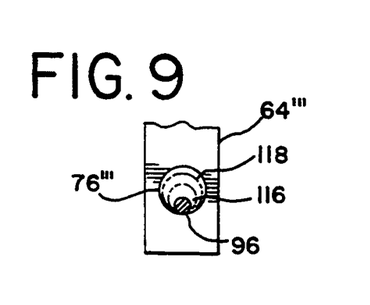
FIG. 9 is a partial perspective view illustrating a further modified securement portion of a clamping bracket similar to the bracket shown in FIG. 6.

A further alternate adjustable securement portion 64''' is illustrated in FIG. 9. The securement portion 64''' includes a circular hole 76''' having a diameter substantially greater than the diameter of the pins 96 used in the embodiment described in relation to FIGS. 4 and 5. Thus, use of pins 116 and 118 (shown in phantom) having diameters greater than the diameter of the pin 96 shown in FIG. 9 will have the effect of providing larger compressive forces to the thermoelectric module 12. The larger diameter pins 116 and 118 will force a larger portion of the securement portion 64''' to extend past the slot 102 in the second thermal conducting member 16', which, in turn, further compresses the leaf springs 38,38'. In addition to providing different compressive forces to a thermoelectric module 12 having a specific width, the adjustable securement portion 64''' can be used in apparatuses for mounting thermoelectric modules having varying widths without the need for obtaining a bracket with longer or shorter legs.

Figure 10:
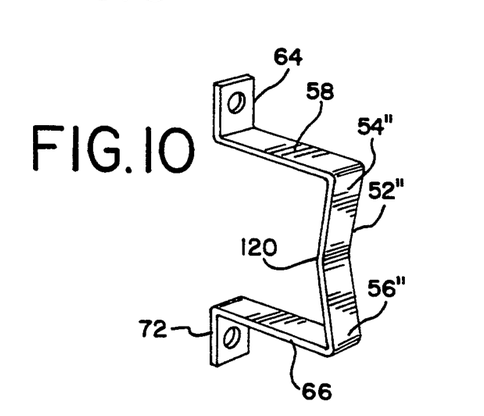
FIG. 10 is a perspective view illustrating a further modified clamping bracket used as part of the apparatus shown in FIG. 1.

As illustrated in FIG. 10, the force generating web is in the form of a spring-forming portion 52" having a central bowed mid portion 120 which is offset from the plane defined by a first end 54" and a second end 56". That is, a leaf spring is integrally formed as part of the clamping bracket. The spring-forming portion 52" generates a compressive force without the need for a separate leaf spring. A first leg 58 and a second leg 66 are integrally connected directly to the first end 54" and the second end 56", respectively, of the spring portion 52". Securement portions 64 and 72 connected to opposing ends of the bracket operate in the same manner described above. It is readily apparent that an integrally formed leaf spring can be incorporated into any of the alternative embodiments described.

Figure 11:
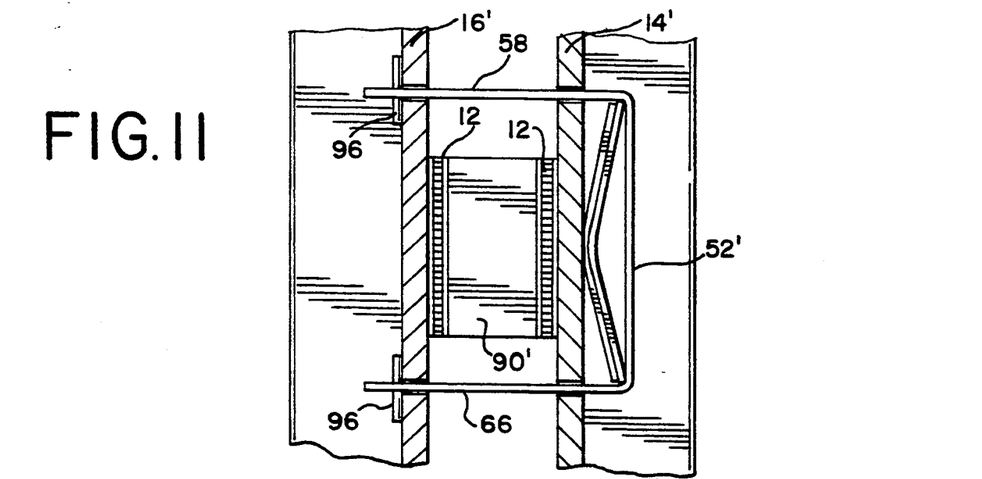
FIG. 11 is cross-sectional view of a modified form of the apparatus shown in FIGS. 4 and 5.

As illustrated in FIG. 11, a thermoelectric module 12 can be positioned on each side of the thermal conducting block 90'.

Additionally, one or more thermoelectric modules 12 may be positioned directly on top of each other. In such an arrangement, the modules can be used in a cascading fashion to direct energy in one direction or the other.

Figure 12:
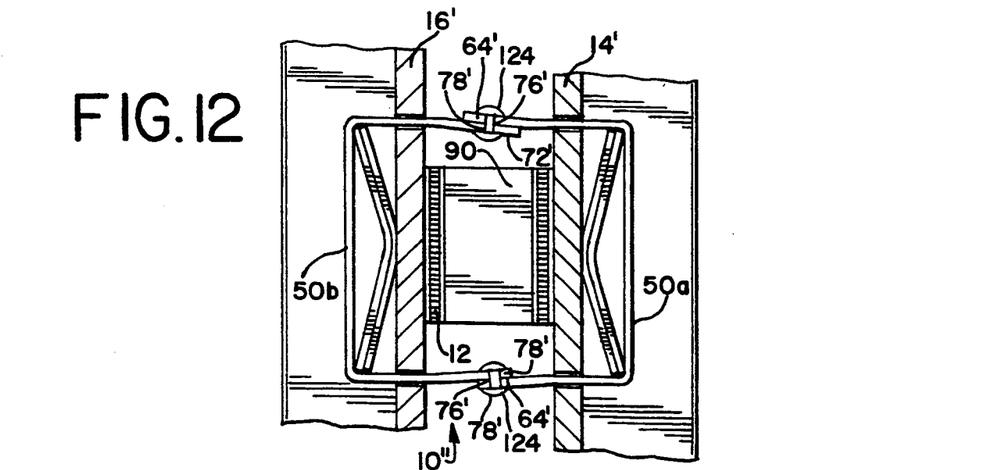
FIG. 12 is a cross-sectional view illustrating a further modified form of the apparatus of the present invention.
Figure 13:
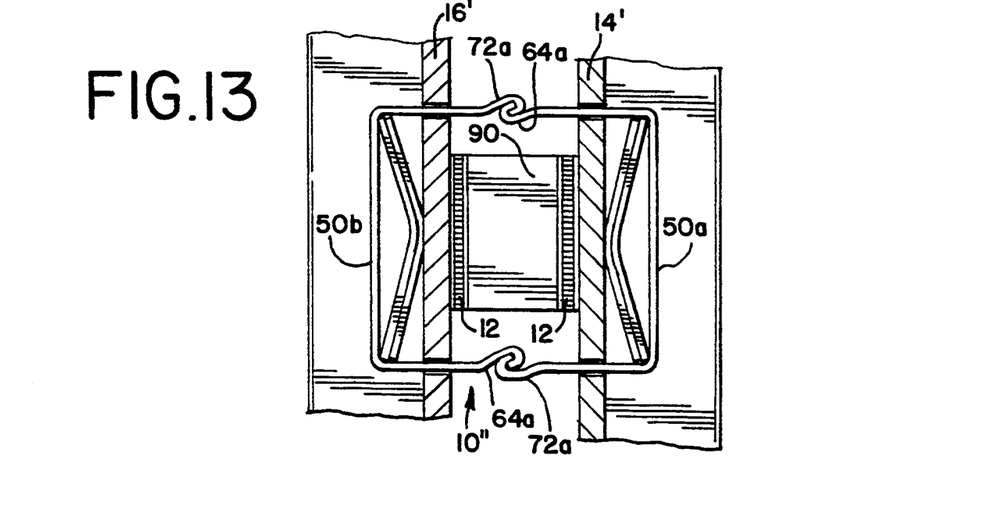
FIG. 13 is a cross-sectional view illustrating a modified form of the apparatus shown in FIG. 12.

A further modified form of the apparatus 10" is illustrated in FIGS. 12 and 13. A pair of thermoelectric modules 12 separated by a thermal conducting block 90 are clamped between a first thermal conducting member 14' and a second thermal conducting member 16'. A first clamping bracket 50a which applies a centrally located compressive force to the second surface 34' of the first thermal conducting member 14' is secured to the second thermal conducting member 16' by means of an opposing second clamping bracket 50b. The second clamping bracket 50b applies a centrally located compressive force to the second surface 46' of the second thermal conducting member 16'.

As shown in FIG. 12, a bolt or screw 124 is inserted through holes 76', 78' of the first and second securement portions 64', 72' of the first and second brackets 50a, 50b. In this manner, the second bracket 50b is fastened to the first bracket 50a to secure the first bracket 50a to the second thermal conducting member 16'. Similarly, the first bracket 50a is used to secure the second bracket 50b to the first thermal conducting member 14'.

FIG. 13 shows a similar arrangement with modified securement portions 64a, 72a on the brackets 50a, 50b. The securement portions 64a, 72a are in the form of a C-shaped clasp or hook. The securement portions 64a, 72a of the first bracket 50a cooperate with the securement portions 64a, 72a of the second bracket 50b to achieve a clamping relationship.

Figure 14:
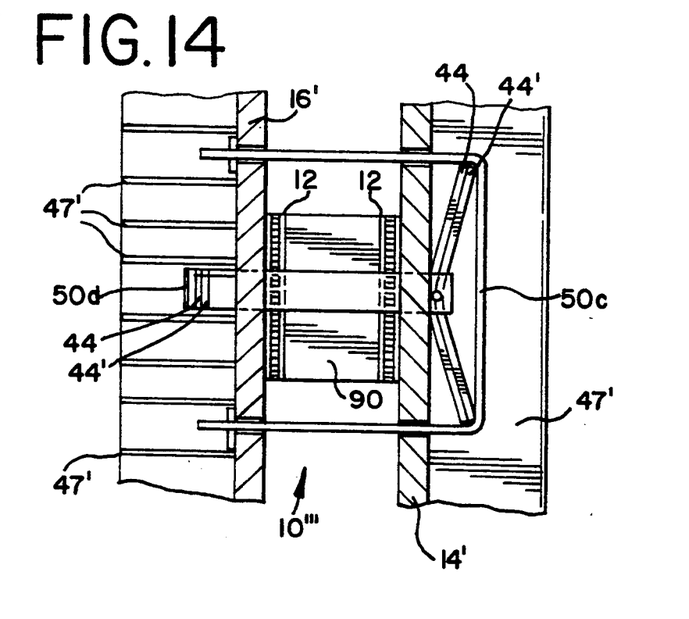
FIG. 14 is a cross-sectional view illustrating a still further modified form of the apparatus of the present invention.

FIG. 14 illustrates a further modified apparatus 10'''. A pair of thermal conducting members 12 separated by a thermal conducting block 90 are secured between a first thermal conducting member 14' and a second thermal conducting member 16'. In this embodiment, the second thermal conducting member 16' is rotated 90° with respect to the first thermal conducting member 14'. A first clamping bracket 50c is utilized in the manner described in relation to the apparatus shown in FIGS. 4 and 5. A second clamping bracket 50d which applies a compressive force to the second surface 46' of the second thermal conducting member 16' is similarly rotated 90° with respect to the first bracket 50c.

Figure 15:
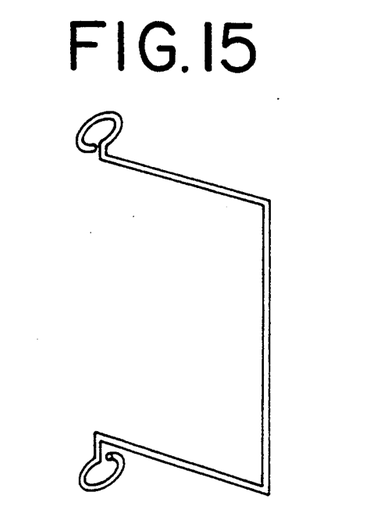
FIG. 15 is a perspective view illustrating a further modified form of a clamping bracket of the apparatus of the present invention.

As illustrated in FIG. 15, the clamping bracket may be formed from a hardened wire as opposed to a thin strip of metal. A small groove can be formed in the ends of the leaf springs to prevent movement of the springs with respect to the wire bracket.

Figure 16:
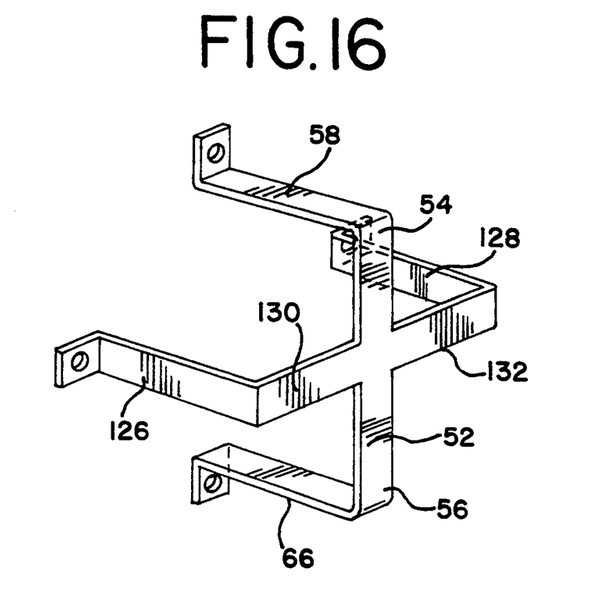
FIG. 16 is a perspective view illustrating a further modified form of a clamping bracket of the apparatus of the present invention.

As illustrated in FIG. 16, the clamping bracket may include more than two legs. Third and fourth bracket legs 126, 128 extend from flanges 130, 132 connected to the mid-portion of the spring engaging portion 52.

While specific embodiments have been illustrated and described, numerous modifications come to mind without markedly departing from the spirit of the invention.

The scope of protection is thus only intended to be limited by the scope of the accompanying claims.

I claim:

1. An apparatus for accurately applying a predetermined compressive force to an element to be mounted between a first compressive member and a second compressive member forming a part of said apparatus, said element to include a generally planar first surface and an opposing generally planar second surface, said apparatus comprising:

said first compressive member having a first generally planar surface adapted to abut said first surface of said element and an opposing second surface;

said second compressive member having a first generally planar first surface and an opposing second surface; and a clamping bracket having a force generating web for applying a centrally located compressive force to said second surface of said first compressive member, said web having a first end and an opposing second end, a first bracket leg having a predetermined length and having a first end extending from said first end of said web and terminating at an opposing second end, a second bracket leg having a predetermined length and having a first end extending from said second end of said web in spaced confronting relation to said first bracket leg and a second opposing end, said second end of said first bracket leg including securing means for securing said first bracket leg to said second compressive member, and said second end of said second bracket leg including securing means for securing said second bracket leg to said second compressive member, wherein said bracket holds said first compressive member and said second compressive member in a clamping relationship about said element.

2. The apparatus of claim 1 wherein said element comprises a thermoelectric module.

3. The apparatus of claim 1 wherein said force generating web of said bracket is a spring engaging portion thereof, at least one spring member to be positioned between said spring engaging portion of said web and said first compressive member, said spring member having a first end, and an opposing second end said mid-portion of said spring member being bowed to be offset from a plane defined by said first and second ends thereof, wherein said bowed portion abuts said second surface of said first compressive member.

4. The apparatus of claim 1 wherein said securing means of said first bracket leg comprises:

a flange connected to said second end of said first bracket leg having a hole wherein said hole is aligned with a bore in said second compressive member when secured to said second compressive member; and a bolt positioned through said hole and having a portion of said bolt inside said bore to secure said flange to said second compressive member.

5. The apparatus of claim 4 wherein said securing means of said second bracket leg comprises:

a flange connected to said second end of said second bracket leg having a hole wherein said hole is aligned with a bore in said second compressive member when secured to said second compressive member; and a bolt positioned through said hole and having a portion of said bolt inside said bore to secure said flange to said second compressive member.

6. The apparatus of claim 1 wherein said second compressive member includes a first slot on a first side of said surface abutting said element and a second slot on a second side of said surface abutting said element, and wherein a portion of said first bracket leg extends through said first slot and a portion of said second bracket leg extends through said second slot when said first and second bracket legs are secured to said compressive member.

7. The apparatus of claim 6 wherein said securing means of said first bracket leg includes a pin positioned through a hole in said portion of said first bracket leg extending through said first slot.

8. The apparatus of claim 7 wherein said securing means of said second bracket leg includes a pin positioned through a hole in said portion of said second bracket leg extending through said second slot.

9. The apparatus of claim 6 wherein said securing means of said first bracket leg comprises:

a first flange on said portion of said first bracket leg extending through said first slot; and a second flange on said portion of said first bracket leg extending through said first slot wherein said first and second flanges are offset from said first bracket leg at opposing angles.

10. The apparatus of claim 9 wherein said securing means of said second bracket leg comprises:

a first flange on said portion of said second bracket leg extending through said second slot; and a second flange on said portion of said second bracket leg extending through said second slot wherein said first and second flanges are offset from said second bracket leg at opposing angles.

11. The apparatus of claim 1 wherein said force generating web of said bracket includes an intermediate bowed portion between said first and second ends, said intermediate bowed portion being offset from a plane defined by said first and second ends, wherein said intermediate bowed portion abuts said second surface of said first compressive member.

12. The apparatus of claim 2 wherein said compressive members are designed to be thermal conducting members.

13. The apparatus of claim 1 wherein said element to be mounted is positioned between said compressive members where it is compressed therebetween by a force generated by the force generating web of said bracket.

14. The apparatus of claim 12 wherein said thermoelectric module to be mounted is positioned between said thermal conducting members where it is compressed therebetween by a force generated by said force generating web of said bracket.

15. An apparatus for accurately applying a predetermined compressive force to a thermoelectric module mounted between a first thermal conducting member and a second thermal conducting member forming part of the apparatus, said thermoelectric module including a generally planar first surface and an opposing generally planar second surface, said apparatus comprising:

said first thermal conducting member having a first generally planar surface adapted to abut said first surface of said thermoelectric module and an opposing second surface;

said second thermal conducting member having a first generally planar surface and an opposing second surface;

a clamping bracket having a force generating web for applying a centrally located compressive force to said second surface of said first thermal conducting member, said web including a spring engaging portion having a first end and an opposing second end, a first bracket leg having a predetermined length and having a first end extending from said first end of said spring engaging portion and an opposing second end, a second bracket leg having a predetermined length and having a first end extending from said second end of said spring engaging portion, said second end of said first bracket leg including means for securing said first bracket leg to said second thermal conducting member, and said second end of said second bracket leg including means for securing said second bracket leg to said second thermal conducting member; and an elongated spring member positioned between said spring engaging portion of said bracket and said second surface of said first thermal conducting member having a first end, an opposing second end and a bowed intermediate portion abutting said second surface of said first thermal conducting member, said intermediate portion offset from a plane defined by said first and second ends wherein said bracket holds said spring member, said first thermal conducting member and said second thermal conducting member in a clamping relationship about said thermoelectric module.

16. The apparatus of claim 15 wherein said securing means of said first bracket leg comprises:

a flange connected to said second end of said first bracket leg having a hole wherein said hole is aligned with a bore in said second thermal conducting member when secured to said second thermal conducting member; and a bolt positioned through said hole and having a portion of said bolt inside said bore to secure said flange to said second thermal conducting member.

17. The apparatus of claim 16 wherein said securing means of said second bracket leg comprises:

a flange connected to said second end of said second bracket leg having a hole wherein said hole is aligned with a bore in said second thermal conducting member when secured to said second thermal conducting member; and a bolt positioned through said hole and having a portion of said bolt inside said bore to secure said flange to said second thermal conducting member.

18. The apparatus of claim 15 wherein said second thermal conducting member includes a first slot on a first side of said surface abutting said thermoelectric module and a second slot on a second side of said surface abutting said thermoelectric module, and wherein a portion of said first bracket leg extends through said first slot and a portion of said second bracket leg extends through said second slot when said first and second bracket legs are secured to said thermal conducting member.

19. The apparatus of claim 18 wherein said securing means of said first bracket leg includes a pin positioned through a hole in said portion of said first bracket leg extending through said first slot.

20. The apparatus of claim 19 wherein said securing means of said second bracket leg includes a pin positioned through a hole in said portion of said second bracket leg extending through said second slot.

21. The apparatus of claim 18 wherein said securing means of said first bracket leg comprises:

a first flange on said portion of said first bracket leg extending through said first slot; and a second flange on said portion of said first bracket leg extending through said first slot wherein said first and second flanges are offset from said first bracket leg at opposing angles.

22. The apparatus of claim 21 wherein said securing means of said second bracket leg comprises:

a first flange on said portion of said second bracket leg extending through said second slot; and a second flange on said portion of said second bracket leg extending through said second slot wherein said first and second flanges are offset from said second bracket leg at opposing angles.

23. An apparatus for accurately applying a predetermined compressive force to a thermoelectric module mounted between a first thermal conducting member and a second thermal conducting member forming part of the apparatus, said thermoelectric module including a generally planar first surface and an opposing generally planar second surface, said apparatus comprising:

said first thermal conducting member having a first generally planar surface adapted to abut said first surface of said thermoelectric module and an opposing second surface;

said second thermal conducting member having a first generally planar surface and an opposing second surface; and a clamping bracket having a force generating web including a first end, an opposing second end, and an intermediate bowed portion offset from a plane defined by said first and second ends wherein said intermediate bowed portion abuts said second surface of said first thermal conducting member, said bracket including a first bracket leg having a predetermined length and having a first end extending from said first end of said spring engaging portion and an opposing second end, a second bracket leg having a predetermined length and having a first end extending from said second end of said spring engaging portion, said second end of said first bracket leg including means for securing said first bracket leg to said second thermal conducting member, and said second end of said second bracket leg including means for securing said second bracket leg to said second thermal conducting member, and wherein said bracket holds said first thermal conducting member and said second thermal conducting member in a clamping relationship about said thermoelectric module.

24. The apparatus of claim 23 wherein said securing means of said first bracket leg comprises:

a flange connected to said second end of said first bracket leg having a hole wherein said hole is aligned with a bore in said second thermal conducting member when secured to said second thermal conducting member; and a bolt positioned through said hole and having a portion of said bolt inside said bore to secure said flange to said second thermal conducting member.

25. The apparatus of claim 24 wherein said securing means of said second bracket leg comprises:

a flange connected to said second end of said second bracket leg having a hole wherein said hole is aligned with a bore in said second thermal conducting member when secured to said second thermal conducting member; and a bolt positioned through said hole and having a portion of said bolt inside said bore to secure said flange to said second thermal conducting member.

26. The apparatus of claim 23 wherein said second thermal conducting member includes a first slot on a first side of said surface abutting said thermoelectric module and a second slot on a second side of said surface abutting said thermoelectric module, and wherein a portion of said first bracket leg extends through said first slot and a portion of said second bracket leg extends through said second slot when said first and second bracket legs are secured to said thermal conducting member.

27. The apparatus of claim 26 wherein said securing means of said first bracket leg includes a pin positioned through a hole in said portion of said first bracket leg extending through said first slot.

28. The apparatus of claim 27 wherein said securing means of said second bracket leg includes a pin positioned through a hole in said portion of said second bracket leg extending through said second slot.

29. The apparatus of claim 26 wherein said securing means of said first bracket leg comprises:

a first flange on said portion of said first bracket leg extending through said first slot; and a second flange on said portion of said first bracket leg extending through said first slot wherein said first and second flanges are offset from said first bracket leg at opposing angles.

30. The apparatus of claim 29 wherein said securing means of said second bracket leg comprises:

a first flange on said portion of said second bracket leg extending through said second slot; and a second flange on said portion of said second bracket leg extending through said second slot wherein said first and second flanges are offset from said second bracket leg at opposing angles.

* * * * *